(12) United States Patent
Szostek et al.

(10) Patent No.: US 10,842,045 B2
(45) Date of Patent: Nov. 17, 2020

(54) HEAT DISSIPATION DEVICE FOR A MULTIMEDIA CONTROL UNIT

(71) Applicant: Aptiv Technologies Limited, St. Michael (BB)

(72) Inventors: Grzegorz Szostek, Morawica (PL); Marcin Hyrlicki, Liszki (PL); Krzysztof Adamczyk, Zegocina (PL); Pawel Brache, Cracow (PL)

(73) Assignee: Aptiv Technologies Limited, St. Michael (BB)

( * ) Notice: Subject to any disclaimer, the term of this patent is extended or adjusted under 35 U.S.C. 154(b) by 0 days.

(21) Appl. No.: 16/466,471

(22) PCT Filed: Dec. 7, 2017

(86) PCT No.: PCT/EP2017/081882
§ 371 (c)(1),
(2) Date: Jun. 4, 2019

(87) PCT Pub. No.: WO2018/108702
PCT Pub. Date: Jun. 21, 2018

(65) Prior Publication Data
US 2019/0335621 A1 Oct. 31, 2019

(30) Foreign Application Priority Data

Dec. 12, 2016 (FR) ...................................... 16 62311

(51) Int. Cl.
*B26D 7/06* (2006.01)
*B26D 5/10* (2006.01)
(Continued)

(52) U.S. Cl.
CPC ......... *H05K 7/20509* (2013.01); *F28F 13/00* (2013.01); *H05K 7/20172* (2013.01); *H05K 7/20409* (2013.01)

(58) Field of Classification Search
CPC ........... H05K 7/20509; H05K 7/20172; H05K 7/20409; F28F 13/00
See application file for complete search history.

(56) References Cited

U.S. PATENT DOCUMENTS 5,343,359 A * 8/1994 Morton .................. H05K 1/141
174/252
5,621,614 A * 4/1997 O'Neill .................. H05K 7/202
361/698

(Continued)

FOREIGN PATENT DOCUMENTS

EP 1 885 169 A1 2/2008

*Primary Examiner* — Binh B Tran
*Assistant Examiner* — Michael A Matey
(74) *Attorney, Agent, or Firm* — Colby Nipper PLLC

(57) ABSTRACT

A heat dissipation device comprises a generally rectangular metal cooling plate; the metal plate comprises, on its upper face, first attachment means for attaching a first printed circuit board, which means are provided for bringing at least one heat-generating zone of the first printed circuit board to bear with the upper face of the plate; the metal plate comprises, on its lower face, second attachment means for attaching a second printed circuit board, which means are provided for bringing at least one heat-generating zone of the second printed circuit board to bear with the lower face of the plate.

17 Claims, 6 Drawing Sheets

(51) Int. Cl.
  *B26D 1/03*      (2006.01)
  *B26D 7/01*      (2006.01)
  *B26D 7/26*      (2006.01)
  *H05K 7/20*      (2006.01)
  *F28F 13/00*     (2006.01)

(56) References Cited

U.S. PATENT DOCUMENTS

| | | | | |
|---|---|---|---|---|
| 5,689,403 | A * | 11/1997 | Robertson, Jr. | H04B 1/036 |
| | | | | 361/695 |
| 5,986,887 | A * | 11/1999 | Smith | H05K 7/20509 |
| | | | | 165/185 |
| 6,151,215 | A * | 11/2000 | Hoffman | H05K 1/144 |
| | | | | 165/104.33 |
| 6,305,463 | B1 * | 10/2001 | Salmonson | G06F 1/20 |
| | | | | 165/185 |
| 6,466,441 | B1 | 10/2002 | Suzuki | |
| 6,707,675 | B1 * | 3/2004 | Barsun | H05K 9/0037 |
| | | | | 174/16.3 |
| 7,111,674 | B2 * | 9/2006 | Pedoeem | H05K 7/1461 |
| | | | | 165/185 |
| 7,130,191 | B2 * | 10/2006 | Lin | H01L 23/467 |
| | | | | 361/695 |
| 7,298,622 | B2 * | 11/2007 | Conner | H01L 23/4006 |
| | | | | 257/E23.084 |
| 7,773,378 | B2 * | 8/2010 | Lin | H05K 7/20409 |
| | | | | 361/690 |
| 10,398,022 | B1 * | 8/2019 | Li | H05K 1/0209 |
| 2004/0218367 | A1 * | 11/2004 | Lin | H05K 1/144 |
| | | | | 361/721 |
| 2005/0073813 | A1 * | 4/2005 | Meyer | H05K 3/301 |
| | | | | 361/704 |
| 2005/0134526 | A1 * | 6/2005 | Willem | G06F 3/1446 |
| | | | | 345/1.3 |
| 2006/0139878 | A1 * | 6/2006 | Widmayer | H05K 7/20918 |
| | | | | 361/695 |
| 2007/0091578 | A1 * | 4/2007 | Chang | H01L 23/427 |
| | | | | 361/719 |
| 2009/0168346 | A1 * | 7/2009 | Miyoshi | H05K 7/20145 |
| | | | | 361/695 |
| 2012/0181003 | A1 * | 7/2012 | Zurowski | H05K 7/20154 |
| | | | | 165/121 |
| 2012/0236576 | A1 * | 9/2012 | Fang | F21V 3/00 |
| | | | | 362/373 |
| 2013/0258596 | A1 * | 10/2013 | Sharaf | H05K 7/20927 |
| | | | | 361/702 |
| 2014/0210072 | A1 * | 7/2014 | Tsukamoto | H01L 23/367 |
| | | | | 257/717 |

* cited by examiner

HEAT DISSIPATION DEVICE FOR A MULTIMEDIA CONTROL UNIT

CROSS-REFERENCE TO RELATED APPLICATION

This application claims the benefit under 35 U.S.C. § 371 of published PCT Patent Application Number PCT/EP 2017/081882, filed 7 Dec. 2017, claiming priority to French patent application number FR1662311 filed on 12 Dec. 2016, and published as WO2018/108702 on 21 Jun. 2018, the entire contents of which is hereby incorporated by reference herein.

TECHNICAL FIELD

The invention relates to the field of automotive multimedia electronic control units. More particularly, the invention relates to a heat dissipation device for a multimedia electronic control unit.

BACKGROUND

The multimedia electronic control units on board automotive vehicles generally comprise a metal casing provided with numerous electronic interface connectors. The metal casing generally comprises electronic modules arranged in metal racks disposed parallel next to each other. Each electronic module is generally dedicated to a multimedia function such as compression or decompression of the sound, compression or decompression of video films, amplification of the sound, reception and processing of the signals of a navigation system, reception and demodulation of radio signals, of wireless communication interface between the vehicle and portable equipment, of interface telephony, etc.

Each metal rack has a metal structure comprising thin fins in order to be used as a heat dissipation device for their respective electronic module. The metal casing also generally comprises openings for discharging heat dissipated by the metal racks. It is also known to facilitate the extraction of hot air from the electronic modules using a fan arranged in the metal casing and facing openings of the metal casing. The metal structure also makes it possible to meet the constraints of electromagnetic interferences between the electronic modules and also the constraints of the radio frequency interferences external to the multimedia control unit.

The known multimedia control units are therefore bulky, heavy and complex to assemble. Their current structure does not meet the weight reduction and volume current requirements for current and future vehicles.

It is therefore important to propose a new solution solving these problems.

SUMMARY

A heat dissipation device comprises a generally rectangular cooling metal plate, the metal plate comprising, on its upper face, first fastening means for fastening a first printed circuit board provided to abut at least one heat generating area of the first printed circuit board on the upper face of the plate. The metal plate comprises, on its lower face, second fastening means for fastening a second printed circuit board provided to abut at least one heat generating area of the second printed circuit board on the lower face of the plate.

The upper face of the plate may comprise a first section equipped with a plurality of vertical cooling fins each extending in a longitudinal direction substantially parallel to one side of the plate; the first section comprising a portion of the first fastening means so as to allow the abutment of a heat generating area of the first printed circuit board on cooling fins. The first section may comprise a flat cooling area extending transversely on the top of at least two fins so as to allow the abutment of a heat generating area of the first printed circuit board on the flat cooling area. The first section may comprise at least one vertical solid cylindrical stud over-molded in a cooling fin so as to allow the abutment of a heat generating area of the first printed circuit board on the free end of the solid cylindrical stud. The first section forms a rectangular recess in the upper face of the plate, forming a rectangular protrusion on the lower face of the plate.

The lower face of the first section may comprise a portion of the second fastening means so as to allow the abutment of at least one heat generating area of the second printed circuit board on the lower face of the first section. The lower face of the first section may comprise at least one flat cooling surface forming a protrusion on said lower face, so as to allow the abutment of a heat generating area of the second printed circuit board on the flat cooling surface.

The plate may include at least three metal pillars extending vertically downwards from the lower face of the plate. The low end of each pillar may be equipped with a fastening means provided to be fastened on a casing bottom so as to keep the plate raised to arrange the second printed circuit board on the lower face of the plate. A transverse side of the plate may include a fan holder able to receive a fan for creating a cooling air flow of the plate in a longitudinal direction. The plate may include deflectors arranged between the fan holder and the first section able to guide the cooling air flow. The plate may include an opening between the first section and the fan holder, so as to promote an air flow on both faces of the plate.

The plate may comprise an electrical connection element comprising two flexible contact ends; the first end being provided to establish electrical contact by compression between the cooling plate and an electrically conductive element of the first printed circuit board or the second printed circuit board; the second end being provided to establish electrical contact by compression between the plate and a metal casing enclosing the heat dissipation device; so as to thermally and electromagnetically protect the electrically conductive element. The electrical connection element may comprise an intermediate portion by which the connection element is fastened on the plate, the intermediate portion being extended, on one side, by the first flexible end mainly in a direction perpendicular to the plate and, on the other side, by the second flexible end mainly in a direction coplanar with the plate. The heat dissipation device can be made in a single metal piece.

According to the invention, an electronic assembly includes the heat dissipation device described above, a first generally rectangular printed circuit board including a heat generating area in abutment on the upper face of the cooling plate; a second generally rectangular printed circuit board including a heat generating area in abutment on the lower face of the cooling plate.

The electronic assembly may include a closed metal casing of generally parallelepiped rectangular shape; the heat dissipation device being fastened in the bottom of the casing. The casing may comprise a first group of openings arranged on a first lateral face of the casing and facing the cooling plate. The casing may also comprise a second group of openings arranged on a second lateral face of the casing opposite the first face and facing the cooling plate so as to allow the circulation of a cooling air flow from the first group of openings to the second group of openings. A fan can be mounted in the fan holder and can be arranged in the casing facing one of the two opening groups so as to facilitate the circulation of the cooling air flow. The plate may include an electrical connection element. At least one of the printed circuit boards comprises a conductive element, the conductive element being in electrical contact, by the electrical connection element, with the plate and the metal casing so as to thermally and electromagnetically protect the conductive element.

Further features and advantages will appear more clearly on a reading of the following detailed description of the preferred embodiment, which is given by way of non-limiting example only and with reference to the accompanying drawings.

BRIEF DESCRIPTION OF DRAWINGS

Other characteristics, objects and advantages of the invention will become apparent upon reading the following detailed description, and with reference to the appended drawings, given by way of non-limiting example and in which.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

'One or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for describing embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Figure 1:
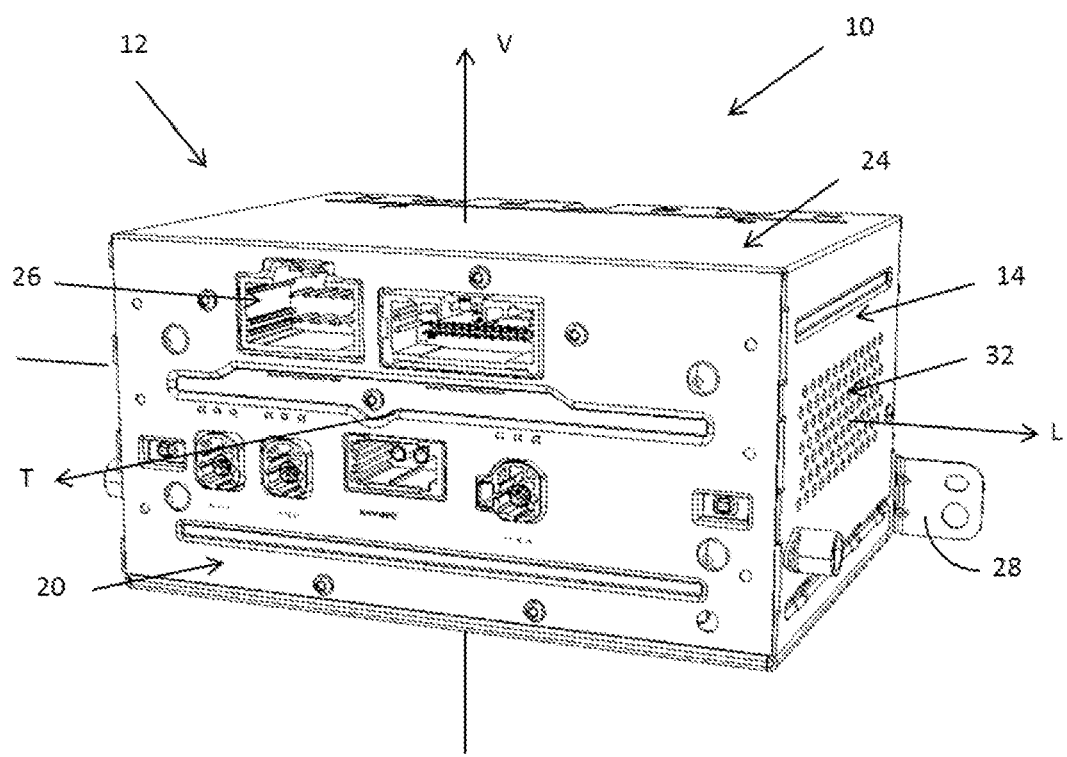
FIG. 1 and FIG. 2 are schematic perspective views of the multimedia control unit according to the invention.
Figure 2:
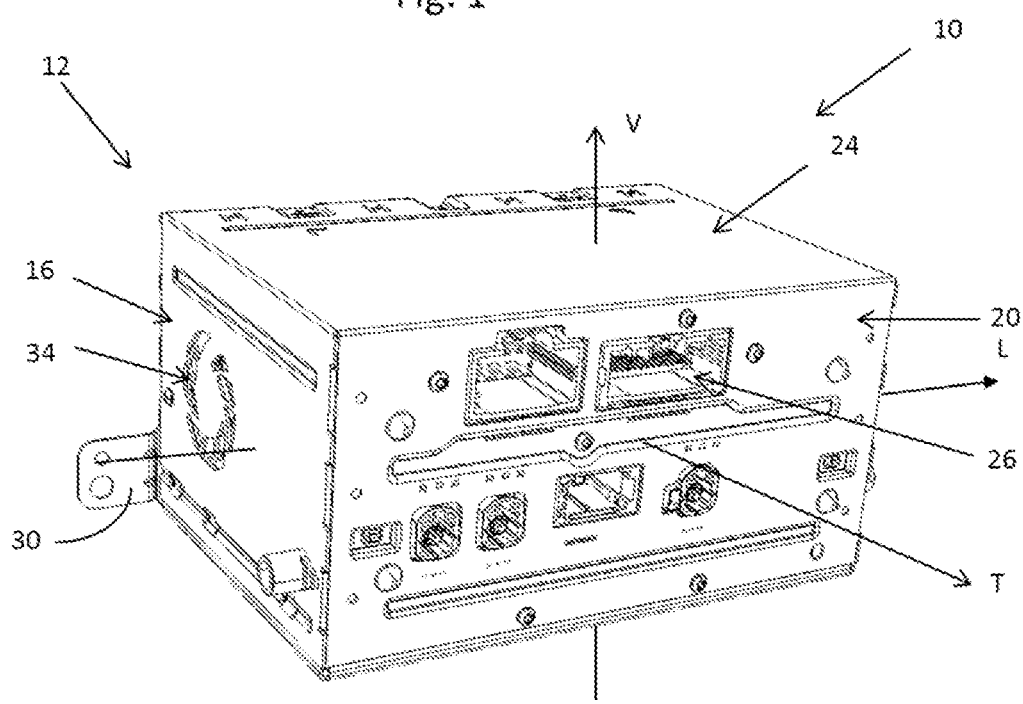
Figure 3:
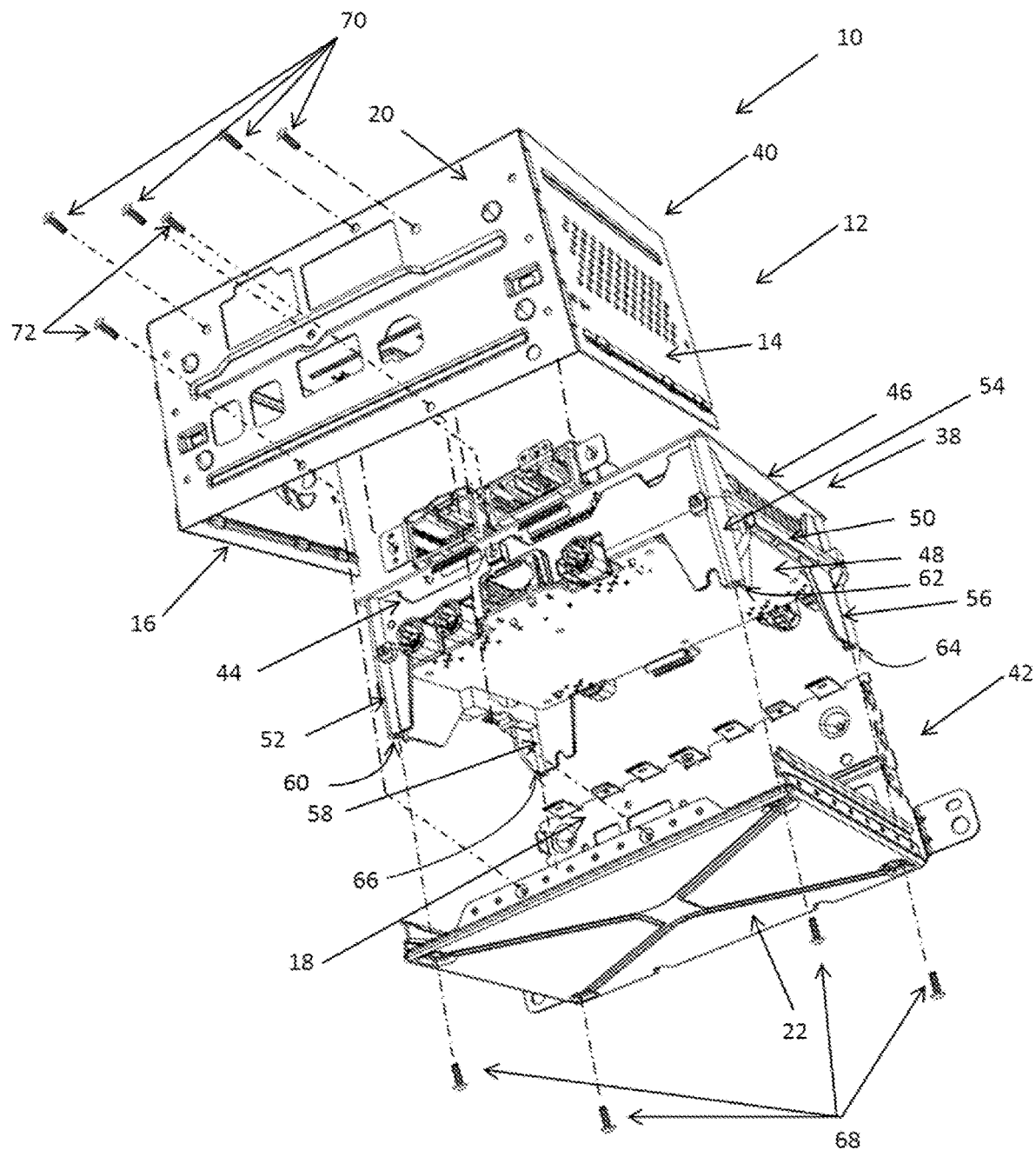
FIG. 3 represents an exploded schematic perspective view of the multimedia control unit according to the invention.

According to FIG. 1, FIG. 2 and FIG. 3, an exemplary embodiment of a multimedia electronic control unit 10 provided to be mounted in a motor vehicle is represented. The multimedia control unit 10 includes a metal casing 12 generally forming a rectangular parallelepiped. The casing 12 of the control unit 10 therefore includes six rectangular facades.

In order to facilitate the description, and in a non-limiting manner, an orthogonal reference frame comprising a longitudinal axis L, a transverse axis T and a vertical axis V is defined. "Low", "top", "above", "below", "lower" and "upper" orientations are defined in the vertical direction. "Left", "right" and "lateral" orientations are defined in the longitudinal direction. "Front" and "rear" orientations are also defined in the transverse direction.

The casing 12 therefore includes, in the direction of the longitudinal axis L, a right lateral facade 14 and a left lateral facade 16. The casing also includes, in the direction of the transverse axis T, a rear facade 18 and a front facade 20. Finally, the casing comprises in the direction of the vertical axis V a lower facade 22 and an upper facade 24. The lower facade 22 of the casing is also called casing bottom.

The front facade 20 and the rear facade 18 include multiple connectors 26 allowing the multimedia control unit 10 to be electrically connected to other electronic equipment of the vehicle. The rear facade 18 includes, on either side along the longitudinal axis, two fastening lugs 28, 30 for mounting the multimedia control unit 10 in the vehicle, more precisely mounting it on the body of the vehicle used as an electrical ground of the vehicle.

The right lateral facade 14 and the left lateral facade 16 include respectively a first group of openings 32 and a second group of openings 34 provided to make an air flow circulate in the multimedia control unit 10. More particularly, the left lateral facade 16 is provided with openings 34 disposed generally as a circle.

The second opening group 34 is provided to extract hot air from the control unit 10. Preferably, a fan 36 is disposed in the control unit 10 to improve the air flow and more particularly to promote the extraction of hot air. The impeller vanes of the fan 36 are arranged directly facing the second opening group 34.

The first opening group 32 is provided to introduce fresh air into the control unit 10 for cooling purposes.

The upper facade 24, together with the other five facades 14, 16, 18, 20, 22, closes the metal casing 12, allowing the casing 12 to be similar to a cage for protection against external electromagnetic interferences.

According to FIG. 3, the multimedia electronic control unit 10 comprises the casing 12 and an electronic subassembly 38.

The casing 12 consists of a first metal part 40 and a second metal part 42. The first metal part 40, made in one piece, brings together the upper facade 24, the front facade 20, the right lateral facade 14 and the left lateral facade 16. The second metal part 42, made in one piece, brings together the lower facade 22 and the rear facade 18.

The electronic subassembly 38 includes a metal heat dissipation device 44 on which are fastened a first printed circuit board 46 and a second printed circuit board 48.

The first printed circuit board 46 is fastened on the top of the heat dissipation device 44. The second printed circuit board 48 is fastened on the bottom of the heat dissipation device 44.

The heat dissipation device 44 includes a metal plate 50 supported by 4 vertical pillars 52, 54, 56, 58 oriented towards the casing bottom 22 and each free end 60, 62, 64, 66 of which is provided with a screw thread. The metal plate 50 is arranged between the two printed circuit boards 46, 48.

For purposes of assembling the multimedia control unit 10, the casing 12 and the electronic subassembly 38 are fastened together by screwing. It will be more particularly noted that the lower facade 22 of the casing includes, at each of its corners, holes through which first fastening screws 68 fit into the screw threads of the four pillars 52, 54, 56, 58 thus ensuring to keep the electronic subassembly 38 into the casing 12. Other fastening screws fasten the other facades to the electronic subassembly 38. More particularly, it will be noted that second fastening screws 70, in particular on the front façade 20, fasten the first metal part 40 of the casing to metal connector bodies of the printed circuit boards 46, 48. Finally, third fastening screws 72 fasten the first metal part 40 of the casing to the second metal part 42 of the casing.

This assembly, by putting into contact the metal parts of the electronic subassembly 38 with the metal casing 12, not only allows to achieve a first level of heat dissipation, and also to achieve a first level of protection of the electronic subassembly against the electromagnetic interferences.

Other fastening screws allowing the assembly of the casing with the electronic subassembly 38 are possible. As an example and in a non-limiting manner, the rear facade may also include a group of fastening screws for connecting the casing 12 to other metal connector bodies of the printed circuit boards.

Alternatively, the heat dissipation device 44 may include three pillars or more, the objective being to keep the plate 50 raised with regard to the casing bottom 22, thus allowing the fastening of the second printed circuit board 48.

Figure 4:
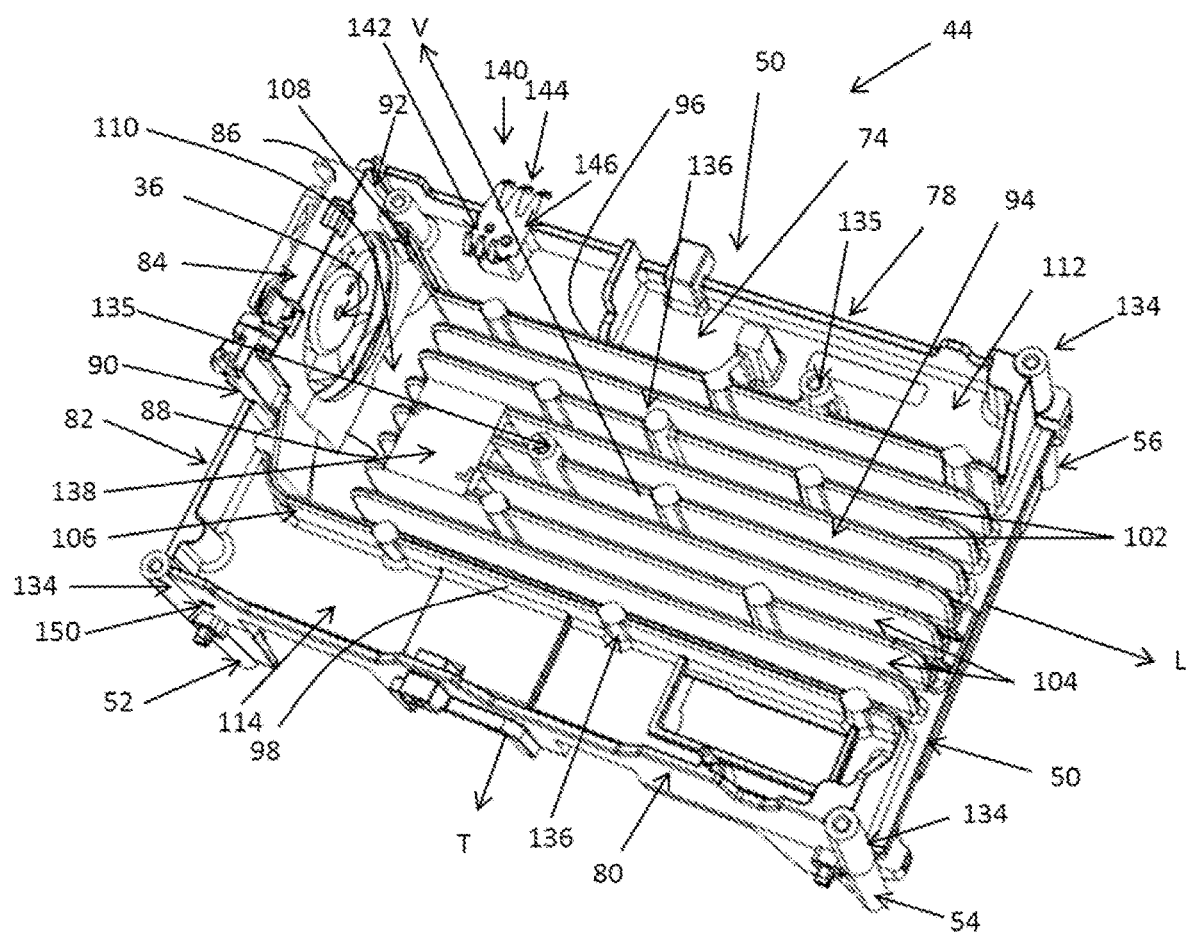
FIG. 4 represents a schematic perspective view of the upper face of the heat dissipation device of the multimedia control unit according to the invention.

According to FIG. 4, the metal plate 50 is generally horizontal along the plane defined by the longitudinal axis L and the transverse axis T. The plate 50 is arranged on the four vertical pillars 52, 54, 56, 58. The plate 50 is generally rectangular and has a horizontal flat space requirement generally similar to the lower facade 22 of the casing. The plate 50 includes an upper face 74 oriented towards the upper facade 24 of the casing and a lower face 76 oriented towards the lower facade 22 of the casing. The plate 50 includes, on its upper face 74, two vertical low walls 78, 80 each extending along its two longitudinal sides. The upper face 74 of the plate also includes a left vertical low wall 82 extending along its left side from the front longitudinal side to an end arranged approximately at mid-length of the left side. A fan holder 84 is arranged transversely between the end of the left vertical low wall 82 and the rear vertical low wall 78.

The fan holder 84 is arranged in continuity with the left vertical low wall 82. The fan holder 84 extends from the end of the left vertical low wall 82 to the rear vertical low wall 78. The fan holder 84 is arranged in a vertical plane perpendicular to the longitudinal axis L.

The fan holder 84 is of generally rectangular shape. The holder includes two transverse edges 86, 88 and two vertical edges 90, 92. The two vertical edges 90, 92 are, one directly in contact with the end of the left vertical low wall 82 and the other directly in contact with the rear vertical low wall 78. The two transverse edges 86, 88 are respectively arranged one at a vertical height above the plate 50, the other at a vertical height below the plate 50. Preferably, the two transverse edges 86, 88 are arranged equidistantly above and below the plate 50. The fan holder 84 has at its center a circular opening of diameter almost identical to the diameter of the impeller of a fan 36, allowing a fan 36 arranged in the holder 84 to ventilate both the upper face of the plate 74 and the lower face of the plate 76.

The upper face of the plate 74 includes a first horizontal flat section 94 of rectangular shape. The first section 94 is delimited by two longitudinal borders parallel to the rear and front sides of the plate. Both longitudinal borders each form respectively a longitudinal rear vertical wall 96 and a longitudinal front vertical wall 98. The first section 94 is centered symmetrically along the longitudinal axis of symmetry L of the plate. The first section 94 extends longitudinally from the transverse right side of the plate 50 up to approximately ⅘ of the length of the plate along the longitudinal axis. The first section 94 also extends transversely, symmetrically on either side of the longitudinal axis of symmetry L of the plate 50 up to a total width along the transverse axis T representing ⅗ of the width of the plate.

The first section 94 forms a rectangular recess in the upper face of the plate, also forming a rectangular protrusion 100 on the lower face of the plate 76.

The first section 94 comprises a plurality of vertical cooling fins 102 directed upwards and each extending along the longitudinal axis L over the entire length of the first section 94. The fins 102 are evenly spaced from each other by inter-fin spaces 104. The plurality of fins 102 is therefore arranged between the longitudinal rear vertical wall 96 and the longitudinal front vertical wall 98 of the first section 94. Each fin is parallel to the longitudinal walls of the first section 94. The longitudinal vertical walls 96, 98 are also comparable to cooling fins.

The rear vertical wall 96 and the front vertical wall 98 of the first section 94 are connected to the fan holder 84 by two additional walls 106, 108. The two additional walls 106, 108 respectively connect the two vertical walls 96, 98 to the two vertical edges 90, 92 of the fan holder 84.

The two additional walls 106, 108 are comparable to two deflectors for advantageously orienting the air flow through the inter-fin spaces of the first section 94. The space between the two additional walls is a gaping opening 110. The gaping opening between the first section 94 and the fan holder 84 can also promote the air flow both on the lower face of the plate 76 and on the upper face of the plate 74.

The upper face of the plate 74 includes, apart from the first section 94 and on either side of the two walls 96, 98 of the first section 94, respectively a second section 112 and a third section 114. The second section 112 and the third section 114 are generally rectangular flat surfaces. The second section 112 is the section directly adjacent to the longitudinal rear vertical wall 96 of the first section 94. The third section 114 is the section directly adjacent to the longitudinal front vertical wall 98.

The second section 112 and the third section 114 extend longitudinally on either side of the first section 94, from the right lateral side of the plate 50 to the left lateral side of the plate 50. The second section 112 and the third section 114 also extend transversely respectively from each longitudinal vertical wall of the first section 96, 98 to the rear vertical low wall 78 and to the front vertical low wall 80 of the plate 50. The second 112 and the third section 114 are slightly raised vertically with respect to the first section 94.

Figure 5:
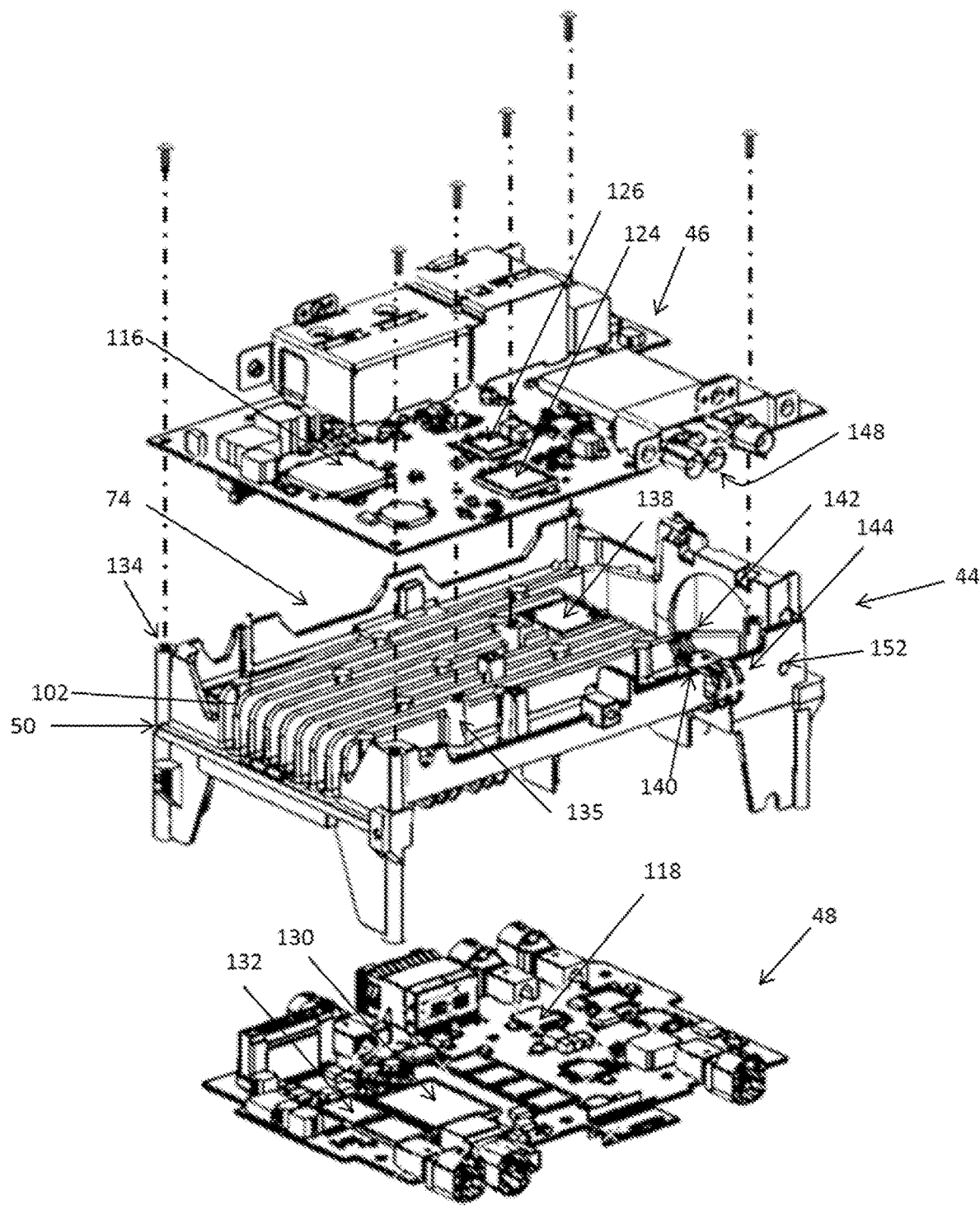
FIG. 5 represents a schematic perspective view of the assembly of a first printed circuit board on the upper face of the heat dissipation device of the multimedia control unit according to the invention.

According to FIG. 4 and FIG. 5, the first printed circuit board 46 and the second printed circuit board 48 include both on their top face and on their bottom face, electronic components 116, 118, 120, 122 connected together by conductive tracks. Some components or some conductive tracks, in particular the tracks conductive of high currents, may form heat generating areas 124, 126, 128, 130, 132, i.e. areas generating heat during operation of the module of the multimedia control unit 10.

The upper face of the plate 74 is adapted to receive the first printed circuit board 46. The upper face of the plate 74 is equipped with several fastening studs 134, 135 for the first printed circuit board 46. The fastening studs 134, 135 provided for the first printed circuit board 46 are oriented vertically upwards and allow keeping flat, along a horizontal plane, the first printed circuit board 46. All the fastening studs 134, 135 have a hollow cylindrical shape, the recess being a screw thread. The first printed circuit board 46 is therefore provided to abut by screwing against the plurality of fins 102 of the first section 94.

According to the embodiment represented, by way of example and in a non-limiting manner, the fastening studs 134 are distributed on the upper face 74 of the plate 50. A first fastening stud 134 is arranged at the end of the second section, in the immediate vicinity of the fan holder and in the immediate vicinity of a first corner of the plate. A second 134, a third 134 and a fourth 134 fastening stud are generally arranged aligned vertically with the three vertical fastening pillars of the heat dissipation device 44 disposed at the other three corners of the plate. A fifth fastening stud 135 is arranged vertically in the fin arranged along the longitudinal axis of symmetry of the plate. The fifth stud is generally arranged to the ⅔ of the length of said fin. Finally, a sixth fastening stud 135 is arranged adjacent to the rear wall of the first section, on the second section 112, generally to the ⅓ of the length of the first section.

More generally, it will be noted that four fastening studs 134 are generally provided to maintain the first printed circuit board 46 at its four corners. Two other fastening studs 135 are arranged on the cooling fins 102, in the vicinity of the heat generating areas 124, 126, 128 of the first printed circuit board 46 so as to improve the abutment of these heat generating areas 124, 126, 128 on the cooling fins 102.

To facilitate the heat dissipation of the first printed circuit board 46, the upper face of the first section 94 includes solid studs 136, whose upper free end is used as an abutment surface for heat generating areas 124, 126 or hot spots of the first power printed circuit board 46 in operation. Each solid stud 136 is of solid cylindrical shape arranged in the plurality of cooling fins 102. Preferably, the solid studs 136 are over-molded with the plurality of cooling fins 102.

Additionally, a generally rectangular flat cooling area 138 is arranged transversely on four fins. The flat cooling area 138 also allows a heat generating area 128 (FIG. 7) of the first printed circuit board 46 to abut on the heat dissipation device 44. The inter-fin spaces 104 under the flat cooling area 138 allow the passage of an air flow promoting the heat dissipation of the heat generating area 128 in abutment on the flat cooling area 138.

Preferably, the heat generating areas 128 are located on the bottom face of the first printed circuit board 46 and are directly in contact by abutment on the flat cooling area 138 and/or directly in contact by abutment with the abutment surfaces of the free end of the solid studs 136. Nevertheless, it is also possible to cool the heat generating areas 124, 126 of the top face of the first printed circuit board 46 when these are in abutment indirectly on the flat cooling area 138 and/or indirectly in abutment on the abutment surfaces of the free end of the solid studs 136; i.e. separated from the flat cooling area 138 and/or from the abutment surfaces of the free end of the solid studs 136 by the thickness of the first printed circuit board 46.

The upper face of the second section 112 includes an electrical connection element 140 comprising two flexible contact ends 142, 144. The electrical connection element 140 comprises an intermediate portion 146 by which the connection element is fastened on the plate 50, the intermediate portion being extended, on one side, by the first flexible end 142 mainly in a direction perpendicular to the plate 50 and, on the other side, by the second flexible end 144 mainly in a direction coplanar with the plate 50.

The intermediate portion 146 comprises two circular holes allowing the clipping of the electrical connection element 140 in two fastening pins of the second section 112. The fastening pins keep the intermediate portion 146 in contact with the upper face of the second section 112. The intermediate portion 146 is extended, on one side, by the first flexible end 142 and, on the other side, by the second flexible end 144.

More specifically, the two pins are arranged on the upper surface of the free end of a cylindrical metal holder with a generally rectangular base. The holder is of the same vertical height as the rear vertical low wall 78. The intermediate portion 146 comes into direct contact with the surface of the free end of the metal holder. The electrical connection element 140 is arranged in the pins so that the first end 142 extends transversely inwardly of the heat dissipation device 44 and vertically upwards and in that the second end 144 extends transversely outside the heat dissipation device 44.

Alternatively, the intermediate portion 146 can be fastened by welding on the plate 50; in this case, the plate 50 does not include pins and the intermediate portion does not include holes.

In other words, the first end 142 and the second end 144 extend on either side of the rear vertical low wall of the plate 78. As a non-limiting example, each flexible end comprises three curved blades so as to form at the free end of the three blades an abutment surface. The three blades of the second end 144 of the electrical connection element 140 are provided to be compressed in abutment between the heat dissipation device 44 and the casing of the control unit. More specifically, each curved end of the three curved blades of the second end 144 is provided to come into contact in abutment on the rear facade of the casing 18.

The three blades of the first end 142 of the electrical connection element 140 are provided to be compressed between the heat dissipation device 44 and a connector of the first printed circuit board 46. More precisely, each curved end of the three curved blades of the first end 142 is provided to come into contact in abutment on the metal body 148 of a connector of the type connector dedicated to the high-speed communications or also a radiofrequency antenna connector or antenna cable.

The electrical connection element 140 allows putting into contact, by crushing of its ends, a metal body connector 148 of the first printed circuit board 46 with the heat dissipation device 44 as well as with the casing 12 of the multimedia control unit 10. It may be, preferably, a connector dedicated to high-speed communications or also a radiofrequency antenna connector or antenna cable.

Putting into contact, by the electrical connection element 140, a connector with the heat dissipation device 44 and the casing allows a local electrical grounding of said connector. It should be understood that the multimedia control unit 10 is provided to be fastened on the body of the vehicle, the body of the vehicle being used as electrical ground. The heat dissipation device 44 in this case acts as a protection against the electromagnetic interferences that may interfere with the signals passing into said connector and also limit the electromagnetic radiation of said connector during the passage of high-speed signals or during radiofrequency signal transmissions.

The rear vertical low wall 78 and the front vertical low wall 80 of the plate 50 each comprise a circular opening 150, 152. Each circular opening 150, 152 is arranged at the upper surface of the second section 112 and the third section 114. As an example and in a non-limiting manner, each circular opening 150, 152 is arranged at the left end of the rear 78 and front 80 vertical low wall. These openings 150, 152 are provided to discharge water that would be formed by condensation on the second and third sections. The water discharged by these circular openings 150, 152 is housed in the bottom of the casing, i.e. in the lower facade 22. The lower facade 22 is equipped at each of its four opening angles allowing the water to be discharged outwardly of the casing.

Figure 6:
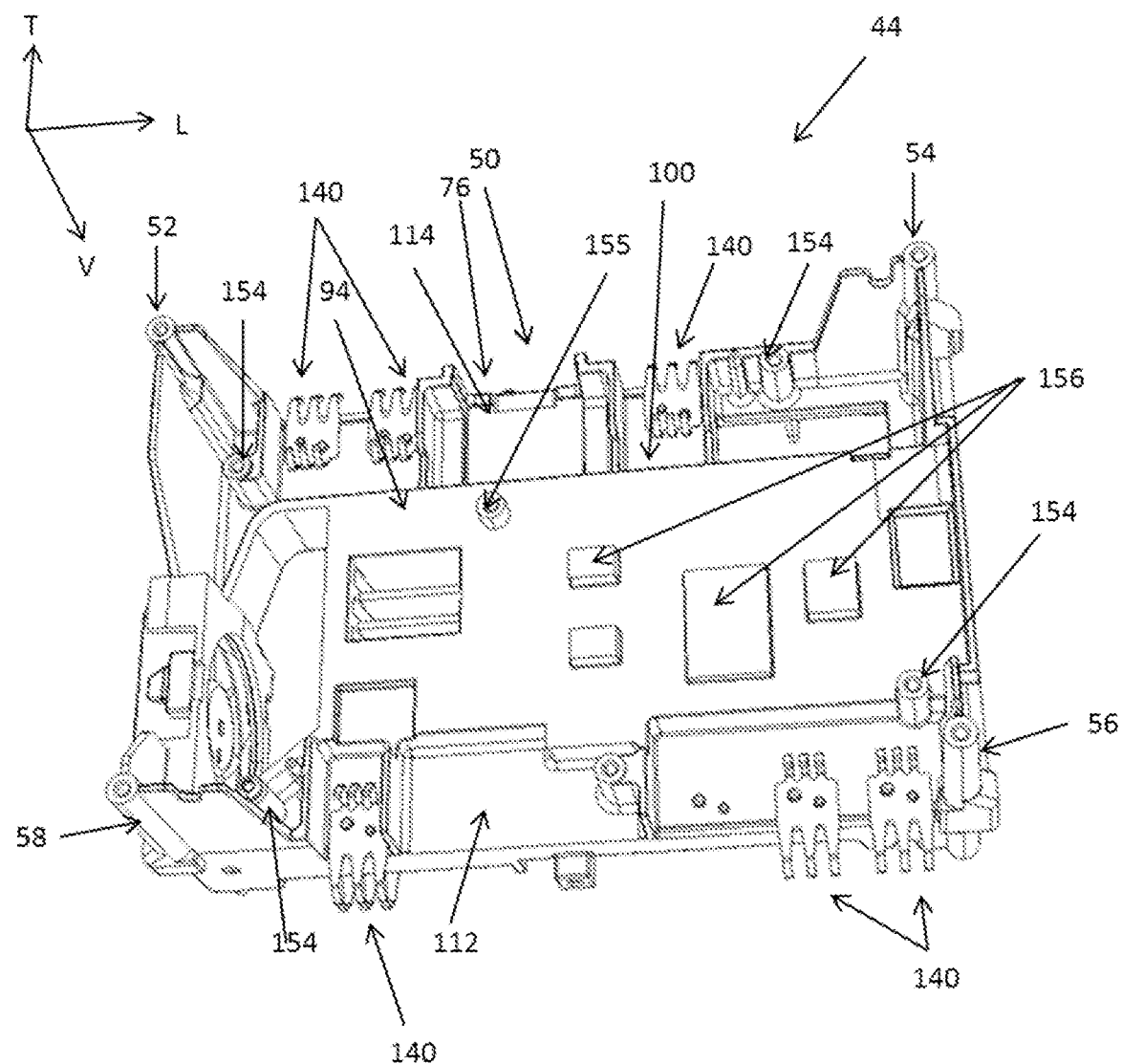
FIG. 6 represents a schematic perspective view of the lower face of the heat dissipation device of the multimedia control unit according to the invention.

According to FIG. 6, the heat dissipation device 44 is presented returned so as to visualize the lower face 76 of the plate 50. The lower face of the first section 94, the second section 112 and the third section 114 are distinguished therein. According to the representation, the lower face of the first section 94 is slightly raised with respect to the flat surfaces of the second and third sections. The lower surface of the first section 94 forms the rectangular protrusion 100 on the lower face of the plate 76.

The lower face of the second 112 and third 114 sections are generally aligned along the same horizontal plane.

Figure 7:
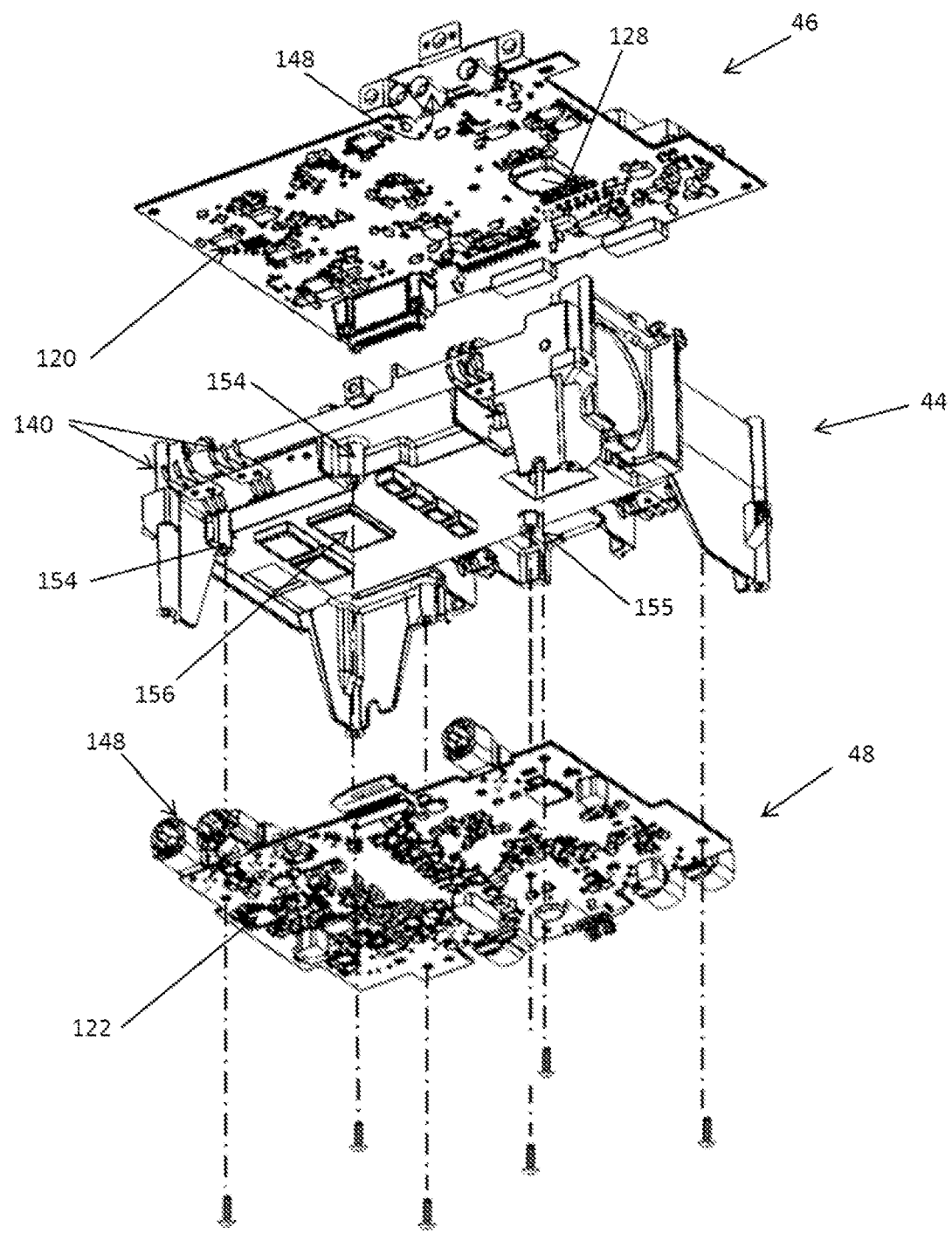
FIG. 7 represents a schematic perspective view of the assembly of a second printed circuit board on the lower face of the heat dissipation device of the multimedia control unit according to the invention.

According to FIG. 6 and FIG. 7, the lower face of the plate 76 is adapted to receive the second printed circuit board 48. The lower face of the plate 76 is equipped with several fastening studs 154, 155 for the second printed circuit board 48. The fastening studs 154, 155 provided for the second printed circuit board 48 are oriented vertically downwards and allow keeping flat, along a horizontal plane, the second printed circuit board 48. All the fastening studs 154, 155 are of hollow cylindrical shape, the recess being a screw thread. The second printed circuit board 48 is therefore provided to be in abutment by screwing against the protruding lower face of the first section of the plate 94.

Generally, it will be noted particularly that four fastening studs 154 are generally provided to keep the second printed circuit board 48 in the vicinity of its four corners. Another fastening stud 155 of the second printed circuit board 48 is arranged on the protruding lower face of the first section 94, so as to improve the abutment of the heat generating areas 130, 132 (FIG. 5) of the second printed circuit board 48 on the first section 94.

In order to be used as a heat dissipation device 44, the lower face of the first section 94 includes generally rectangular flat cooling surfaces 156 slightly raised with respect to the surface of the first section 94 so as to form protrusions on the lower face of the first section 94. These flat cooling surfaces 156 allow heat generating areas 130, 132 of the second printed circuit board 48 to abut on the heat dissipation device 44.

Preferably, the heat generating areas 130, 132 are located on the top face of the second printed circuit board 48 and are directly in contact by abutment on the flat cooling surfaces 156. Nevertheless, it is also possible to cool heat generating areas of the bottom face of the second printed circuit board 48 when they are in abutment indirectly on the flat cooling surfaces 156; i.e., separated from the flat cooling surfaces 156 by the thickness of the printed circuit board.

According to the represented embodiment, the heat dissipation device 44 is made in a single metal piece. In other words, the plate 50, the first section 94, the second section 112, the third section 114, the plurality of fins 102, the fan holder 84, the vertical fastening pillars 52, 54, 56, 58 of the heat dissipation device 44 on the casing bottom 22, the solid studs 136, the fastening studs 135, 136, 154, 155, the cooling surfaces 156, the flat cooling area 138 are made in a single metal piece. Only electrical connection elements 140, screws and printed circuits boards 46, 48 equipped with their electronic components and connectors are additional parts added onto the heat dissipation device 44.

The lower face of the plate 76 includes six electrical connection elements 140 allowing to put into contact, by crushing of their flexible end, a metal body connector 148 of the second printed circuit board 48 to the heat dissipation device 44 and to the casing 12 of the multimedia control unit 10. These six electrical connection elements 140 are identical and have the same function as the one described and mounted on the upper face of the plate 74.

More generally, the electrical connection elements 140 can also be used to put into contact a conductive element of the first printed circuit board 46 or of the second printed circuit board 48 with the plate 50 and the casing 12 so as to protect the conductive element against thermal heating and against electromagnetic interferences. An electrical ground copper track can be a conductive element of the printed circuit boards, as well as metal component bodies 148.

According to FIGS. 3, 5 and 7, a method for assembling the multimedia control module 10 may comprise several steps. A first step consists of disposing two printed circuit boards 46, 48 with heat generating areas 124, 126, 128, 130, 132. A second step consists in disposing a heat dissipation device 44 as previously described through FIGS. 4 and 6. A third step consists in disposing a casing 12 comprising a casing bottom 22 and a front facade 20. A fourth step consists in fastening the first printed circuit board 46 on the upper face of the plate 74 in order to put into contact the heat generating areas 124, 126, 128 of the first printed circuit board 46 on the upper face of the plate 74. A fifth step consists in fastening the second printed circuit board 48 on the lower face of the plate 76 in order to put into contact the heat generating areas 130, 132 of the second printed circuit board 48 on the lower face of the plate 76. A sixth step consists in fastening the fastening pillars 52, 54, 56, 58 of the heat dissipation device 44 equipped with both printed circuit boards 46, 48 on the casing bottom 22.

Other assembly steps can improve heat dissipation and protection against electromagnetic interferences of the multimedia control unit 10. An additional step may consist in arranging electrical connection elements 140 comprising flexible ends 142, 144 on the plate 50 so as to put into contact, by compression of the flexible ends, conductive elements 148 of the printed circuit boards 46, 48 with the plate 50 and the casing 12. Another step may consist in fastening the assembly of the plate 50 with the printed circuit boards 46, 48 on one of the facades of the casing 14, 16, 18, 20. Another step may consist in providing a casing 12 whose two facades comprise openings 32, 34 allowing the circulation of an air flow in the multimedia control unit 10. A step may consist in assembling a fan 36 facing a facade 16 comprising the openings 34 in order to facilitate the circulation of an air flow in the multimedia control unit 10.

The invention claimed is:

1. A heat dissipation device, comprising:
a generally rectangular cooling metal plate including, on its upper face, first fastening means for fastening a first printed circuit board provided to abut at least one heat generating area of the first printed circuit board on the upper face of the plate, wherein the metal plate includes, on its lower face, second fastening means for fastening a second printed circuit board provided to abut at least one heat generating area of the second printed circuit board on the lower face of the plate, wherein the upper face of the plate has a first section equipped with a plurality of vertical cooling fins each extending in a longitudinal direction substantially parallel to one side of the plate, wherein the first section includes a portion of the first fastening means, thereby allowing the abutment of a heat generating area of the first printed circuit board on cooling fins, wherein the first section comprises at least one vertical solid cylindrical stud over-molded in a cooling fin so as to allow the abutment of a heat generating area of the first printed circuit board on a free end of the solid cylindrical stud.

2. The heat dissipation device according to claim 1, wherein the first section comprises a flat cooling area extending transversely on the top of at least two fins so as to allow the abutment of a heat generating area of the first printed circuit board on the flat cooling area.

3. The heat dissipation device according to claim 1, wherein the first section forms a rectangular recess in the upper face of the plate, thereby forming a rectangular protrusion on the lower face of the plate.

4. The heat dissipation device according to claim 1, wherein the lower face of the first section comprises a portion of the second fastening means so as to allow the abutment of at least one heat generating area of the second printed circuit board on the lower face of the first section.

5. The heat dissipation device according to claim 1, wherein the lower face of the first section comprises at least one flat cooling surface forming a protrusion on said lower face, so as to allow the abutment of a heat generating area of the second printed circuit board on the flat cooling surface.

6. A heat dissipation device, comprising:
a generally rectangular cooling metal plate including, on its upper face, first fastening means for fastening a first printed circuit board provided to abut at least one heat generating area of the first printed circuit board on the upper face of the plate, wherein the metal plate includes, on its lower face, second fastening means for fastening a second printed circuit board provided to abut at least one heat generating area of the second printed circuit board on the lower face of the plate, wherein the upper face of the plate has a first section equipped with a plurality of vertical cooling fins each extending in a longitudinal direction substantially parallel to one side of the plate, wherein the first section includes a portion of the first fastening means, thereby allowing the abutment of a heat generating area of the first printed circuit board on cooling fins, wherein the plate includes at least three metal pillars extending vertically downwards from the lower face of the plate; the low end of each pillar is equipped with a fastening means provided to be fastened on a casing bottom so as to hold the plate raised to arrange the second printed circuit board on the lower face of the plate.

7. The heat dissipation device according to claim 6, wherein a transverse side of the plate includes a fan holder able to receive a fan for creating a cooling air flow of the plate in a longitudinal direction.

8. The heat dissipation device according to claim 7, wherein the plate includes deflectors arranged between the fan holder and the first section able to guide the cooling air flow.

9. The heat dissipation device according to claim 7, wherein the plate includes an opening between the first section and the fan holder, so as to promote an air flow on both faces of the plate.

10. A heat dissipation device, comprising:
a generally rectangular cooling metal plate including, on its upper face, first fastening means for fastening a first printed circuit board provided to abut at least one heat generating area of the first printed circuit board on the upper face of the plate, wherein the metal plate includes, on its lower face, second fastening means for fastening a second printed circuit board provided to abut at least one heat generating area of the second printed circuit board on the lower face of the plate, wherein the upper face of the plate has a first section equipped with a plurality of vertical cooling fins each extending in a longitudinal direction substantially parallel to one side of the plate, wherein the first section includes a portion of the first fastening means, thereby allowing the abutment of a heat generating area of the first printed circuit board on cooling fins, wherein the plate comprises an electrical connection element comprising two flexible contact ends, wherein the first end is provided to establish electrical contact by compression between the cooling plate and an electrically conductive element of the first printed circuit board or the second printed circuit board, wherein the second end is provided to establish electrical contact by compression between the plate and a metal casing enclosing the heat dissipation device so as to thermally and electromagnetically protect the electrically conductive element.

11. The heat dissipation device according to claim 10, wherein the electrical connection element comprises an intermediate portion by which the connection element is fastened on the plate, the intermediate portion being extended, on one side, by the first flexible end mainly in a direction perpendicular to the plate and, on the other side, by the second flexible end mainly in a direction coplanar with the plate.

12. The heat dissipation device according to claim 10, wherein the heat dissipation device is made in a single metal piece.

13. An electronic assembly comprising:
a heat dissipation device according to any one of the preceding claims;
a first printed circuit board including a heat generating area in abutment on the upper face of the cooling plate; and
a second printed circuit board including a heat generating area in abutment on the lower face of the cooling plate.

14. The electronic assembly according to claim 13, wherein the electronic assembly further comprises:
a closed metal casing of generally parallelepiped rectangular shape, wherein the heat dissipation device is fastened in the bottom of the casing.

15. The electronic assembly according to claim 14, wherein the casing comprises;
a first group of openings arranged on a first lateral face of the casing and facing the cooling plate; and
a second group of openings arranged on a second lateral face of the casing opposite the first face and facing the cooling plate, wherein the first and second group of openings are configured to allow the circulation of a cooling air flow from the first group of openings to the second group of openings.

16. The electronic assembly according to claim 15, wherein a fan is mounted in the fan holder and is arranged in the casing facing one of the two opening groups so as to facilitate the circulation of the cooling air flow.

17. The electronic assembly according to claim 14, wherein the plate includes an electrical connection element, wherein at least one of the printed circuit boards comprises a conductive element, and wherein the conductive element is in electrical contact, by the electrical connection element, with the plate and the metal casing so as to thermally and electromagnetically protect the conductive element.

* * * * *